(12) United States Patent
Yan et al.

(10) Patent No.: US 7,764,082 B2
(45) Date of Patent: Jul. 27, 2010

(54) ON-DIE TERMINATION CIRCUIT

(75) Inventors: Gang Yan, Shanghai (CN); Xiaomin Si, San Jose, CA (US); Larry Wu, Shanghai (CN); Jie Zhang, Shanghai (CN)

(73) Assignee: Montage Technology Group Limited

( * ) Notice: Subject to any disclaimer, the term of this patent is extended or adjusted under 35 U.S.C. 154(b) by 91 days.

(21) Appl. No.: 11/943,581

(22) Filed: Nov. 20, 2007

(65) Prior Publication Data
US 2009/0174507 A1    Jul. 9, 2009

(51) Int. Cl.
*H03K 17/16*    (2006.01)
(52) U.S. Cl. .......................... 326/30; 326/87
(58) Field of Classification Search ............ 326/21, 326/26, 27, 30, 83–87
See application file for complete search history.

(56) References Cited
U.S. PATENT DOCUMENTS 6,127,840 A * 10/2000 Coteus et al. ............... 326/30
6,917,546 B2 * 7/2005 Matsui ...................... 365/198
7,038,498 B2 * 5/2006 Funaba ........................ 327/77
7,154,295 B2 * 12/2006 Choe ........................... 326/30
7,282,955 B2 * 10/2007 Kim ............................ 326/87

OTHER PUBLICATIONS

"On-Die Termination Resistors With Analog Impedance Control for Standard CMOS Technology", Yongping Fan and Jeffrey E. Smith, IEEE Journal of Solid-State Circuits, vol. 38, No. 2, Feb. 2003.

* cited by examiner

*Primary Examiner*—Don P Le
(74) *Attorney, Agent, or Firm*—The Law Offices of Ivy Mei

(57) ABSTRACT

Methods and apparatuses to terminate transmission lines using voltage limiters. In one aspect, a termination circuit is integrated on a substrate to terminate a transmission line connected from outside the substrate. The termination circuit includes: a port to interface with the transmission line; a first resistive path including a first voltage limiter coupled between the port and a first power supply voltage provided on the substrate resistive path; and a second resistive path including a second voltage limiter coupled between the port and a second power supply voltage provided on the substrate.

16 Claims, 6 Drawing Sheets

ON-DIE TERMINATION CIRCUIT

FIELD OF THE TECHNOLOGY

At least some embodiments of the disclosure relate to termination circuits for signal transmission lines in general and, particularly but not limited to, termination circuits that are integrated on the substrates of integrated circuits.

BACKGROUND

Some signaling schemes, such as Gunning Transistor Logic (GTL) and low-swing current-mode signaling schemes, require termination resistors for the signal transmission lines. Traditionally, termination resistors are placed on the Printed Circuit Board (PCB).

FIG. 1 shows a conventional termination circuit. The termination circuit includes resistors (11 and 13) that are connected in serial between two power supply voltages: $V_{cc}$ (17) and Ground (15). When each of the two resistors (11 and 13) has impedance of 2×R, the termination circuit provides termination impedance of R for the receiver input, which is to be connected between the two resistors (11 and 13). In FIG. 1, the voltage of the receiver input point is biased by the resistors (11 and 13) at the operation point of $V_{cc}/2$.

Recently, termination resistors have been placed on the silicon chip. Termination resistors integrated on the semiconductive substrate can be implemented via a poly resistor, a PMOS transistor, a combination of poly resistor and a PMOS transistor, a parallel NMOS and PMOS structure, etc. For example, Yongping Fan and Jeffrey E. Smith presented a resistor circuit for an on-die termination circuit in "On-Die Termination Resistors with Analog Impedance Control for Standard CMOS Technology, IEEE Journal of Solid-State Circuits, Vol. 38, No. 2, February 2003, pp. 361-364.

When the termination circuit is implemented via passive resistors, the linearity of the termination circuit is excellent. The current consumed by the termination circuit is almost constant, which can be expressed by the equation: $I_t = V_{cc}/(4 \times R)$. When the termination resistors are implemented using other techniques (e.g., the resistor circuit of Yongping Fan and Jeffrey E. Smith), the termination circuit consumes a similar amount of power.

A highly integrated circuit chip may include a large number of input/output (I/O) pins that need termination circuits. The termination circuits of the I/O pins can consume a significant amount of power.

SUMMARY OF THE DESCRIPTION

Methods and apparatuses to terminate transmission lines using voltage limiters are described herein. Some embodiments are summarized in this section.

In one aspect, a termination circuit is integrated on a substrate to terminate a transmission line connected from outside the substrate. The termination circuit includes: a port to interface with the transmission line; a first resistive path including a first voltage limiter coupled between the port and a first power supply voltage provided on the substrate resistive path; and a second resistive path including a second voltage limiter coupled between the port and a second power supply voltage provided on the substrate.

In one embodiment, the first power supply voltage is $V_{cc}$; and the second power supply voltage is ground.

In one embodiment, the first resistive path and the second resistive path have substantially equal impedance. The first voltage limiter and the second voltage limiter are to maintain substantially equal and constant voltages when the first and second resistive paths have changing currents.

In one embodiment, the first voltage limiter is implemented using a diode; and the second voltage is implemented using a diode.

In one embodiment, the first voltage limiter is implemented using a Metal Oxide Semiconductor Field Effect Transistor (MOSFET) biased to maintain a substantially constant voltage; and the second voltage limiter is implemented using a Metal Oxide Semiconductor Field Effect Transistor (MOSFET) biased to maintain a substantially constant voltage. In one embodiment, the first voltage limiter includes an n-channel transistor; and the second voltage limiter includes a p-channel transistor. In one embodiment, the termination circuit further includes an inverter coupled between the first and second voltage limiters to provide an inverted version of a bias signal of the first voltage limiter to the second voltage limiter.

In one embodiment, impedance of the first resistive path is controlled by a first voltage; and impedance of the second resistive path is controlled by a second voltage. A calibration circuit is used to determine the first and second control voltages during a calibration mode. In one embodiment, the calibration circuit is also integrated on the substrate of the integrated circuit.

In one embodiment, the calibration circuit includes a third resistive path connected to a fourth resistive path. The third resistive path is substantially same as the first resistive path. The fourth resistive path is substantially same as the second resistive path. During the calibration mode, a known current is connected with the port; the third and fourth resistive paths are coupled between the first and second power supply voltages; and a reference voltage is compared with a voltage difference between the port and a connection point between the third and fourth resistive paths to determine the first control voltage.

In another aspect, an on-die termination circuit of an integrated circuit, includes: a first resistor element; a second resistor element coupled with the first resistor element, a signal transmission line to be connected to a point between the first and second resistor elements for termination; a first voltage limiter coupled between the first resistor element and a first power supply voltage of the integrated circuit; and a second voltage limiter coupled between the second resistor element and a second power supply voltage of the integrated circuit.

In one embodiment, the first voltage limiter is implemented using an NMOS transistor biased to maintain a constant voltage between source and drain; and the second voltage limiter is implemented using a PMOS transistor biased to maintain a constant voltage between source and drain. An inverter is coupled between a gate of the NMOS transistor and a gate of the PMOS transistor. In one embodiment, the integrated circuit is a Complementary Metal Oxide Semiconductor (CMOS) integrated circuit.

In one embodiment, the impedance of the first resistor element is adjustable via a control signal; and the integrated circuit includes a calibration circuit. During a calibration mode, the calibration circuit is to be coupled to the termination circuit to determine the control signal to calibrate the impedance between the first power supply voltage and the point between the first and second resistor elements. During a normal operation mode (e.g., when not in the calibration mode), the calibration circuit is to be decoupled from the termination circuit.

In one embodiment, the calibration circuit includes a current source selectively coupled to the receiver input point between the first and second resistor elements.

In a further aspect, a device having an integrated circuit formed on a semiconductive substrate, includes: an input/output (I/O) pin to connect the integrated circuit to a signal transmission line from outside of the device; and a termination circuit coupled with the I/O pin and integrated on the semiconductive substrate, the termination circuit to provide a predetermined termination impedance for the transmission line, the termination circuit including a first resistor, a second resistor and at least one voltage limiter connected in serial between a first power supply voltage and a second power supply voltage, the I/O pin being connected between the first and second resistors.

In one embodiment, the device further includes a calibration circuit integrated on the semiconductive substrate, the calibration circuit coupled with the termination circuit in a calibration mode and decoupled from the termination circuit during a normal operation mode, the calibration circuit including a circuit path to provide a known current through one of the first and second resistors when in the calibration mode, the calibration circuit further including a control signal generator to determine a control signal to adjust one of the first and second resistors based on comparing a reference voltage with a voltage change caused by the known current.

Other features will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the disclosure are not necessarily references to the same embodiment; and, such references mean at least one.

One embodiment of the invention provides an on-die termination circuit that consumes less power than a traditional termination circuit. In one embodiment, the on-die termination circuit is used on a high-speed Complementary Metal Oxide Semiconductor (CMOS) integrated circuit.

Figure 1:
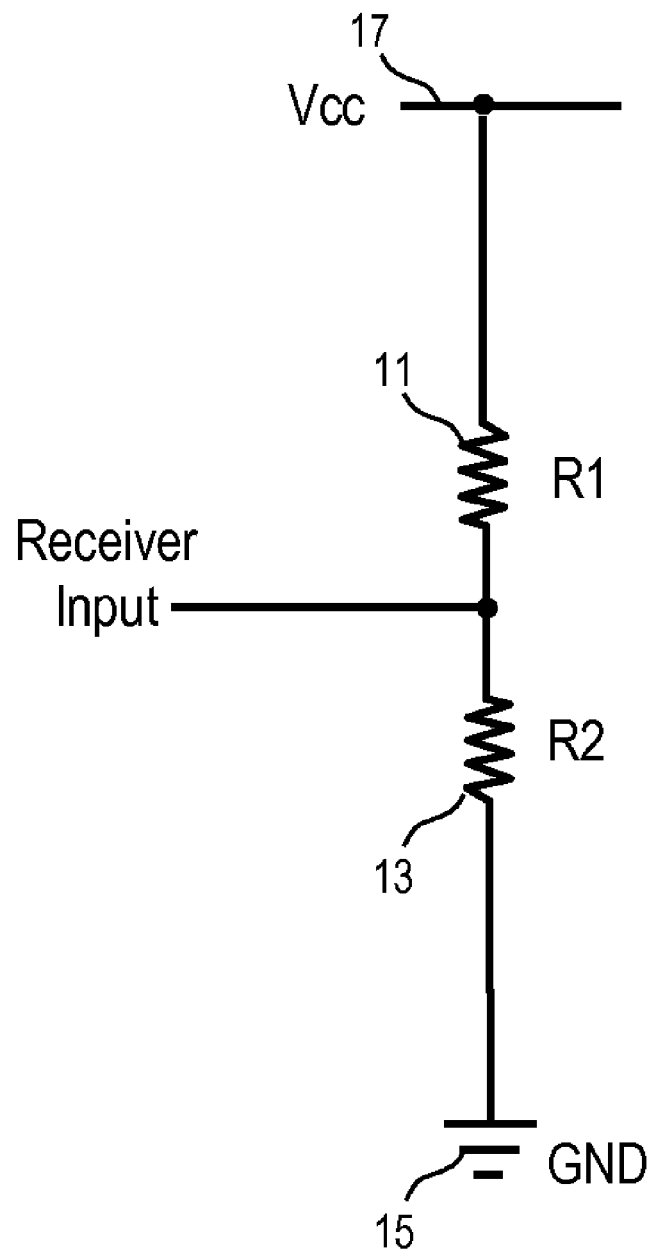
FIG. 1 shows a conventional termination circuit.

In one embodiment, an on-die termination circuit uses a voltage limiter to reduce the Direct Current (DC) used in the termination circuit. In one embodiment, the on-die termination circuit provides the same operating voltage level for the receiver input line and the same desired Alternating Current (AC) impedance as the traditional termination circuit, but consumes significantly less power than the traditional termination circuit illustrated in FIG. 1.

Figure 2:
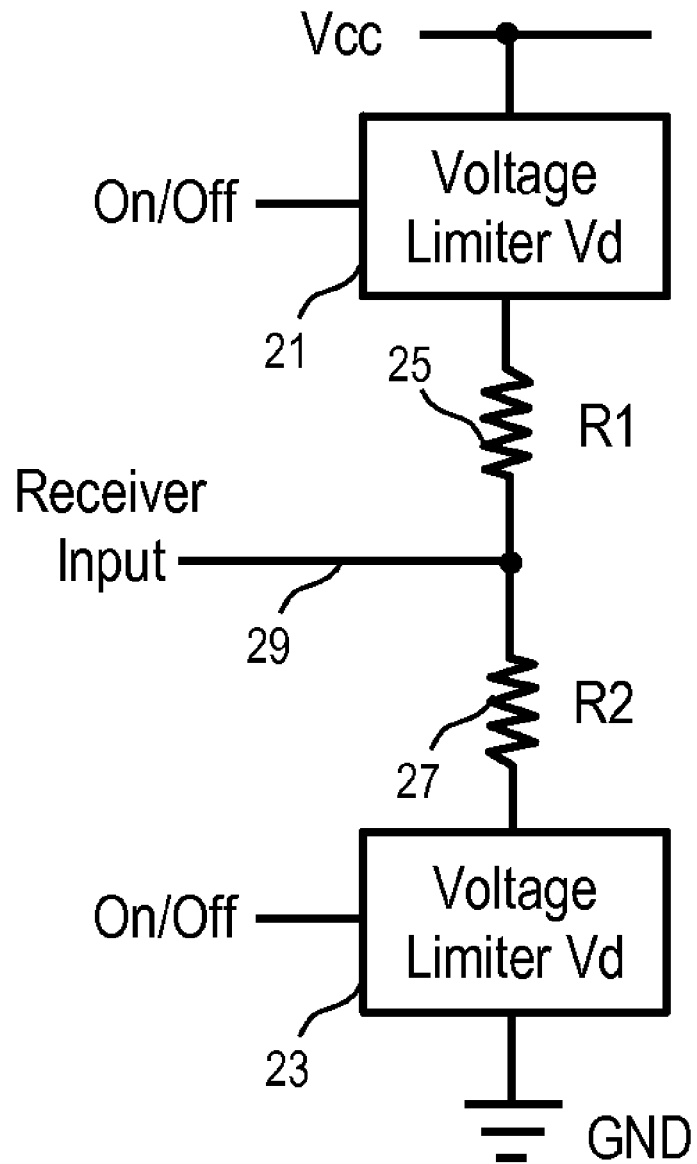
FIG. 2 shows a termination circuit according to one embodiment.

FIG. 2 shows a termination circuit according to one embodiment. In FIG. 2, the termination circuit includes two resisters (25 and 27) and two voltage limiters (21 and 23) connected in serial between two power supply voltages ($V_{cc}$ and ground).

In FIG. 2, the voltage limiters (21 and 23) are used to maintain constant voltages $V_d$. Thus, the voltage applied on the resistors (25 and 27) is reduced (e.g., reduced to $V_{cc}-2\times V_d$.

In one embodiment, the impedance of the voltage limiters (21 and 23) is negligible when compared to the resistors (25 and 27). The impedance of each of the two resisters (25 and 27) is approximately $2\times R$. Thus, the termination impedance of the circuit is a desired value R. Since the voltage applied on the resistors (25 and 27) is reduced to $V_{cc}-2\times V_d$, the DC current consumption of the termination circuit is reduced to $(V_{cc}-2\times V_d)/(4\times R)$ from $V_{cc}/(4\times R)$.

In FIG. 2, the voltage swing of the receiver input is limited to the range between $V_d$ and $V_{cc}-V_d$. Beyond the range, the impedance may increase up to $2\times R$. However, the impedance of the termination circuit at the operation point around $V_{cc}/2$ is very close to the desired impedance R.

In one embodiment, the voltage limiters (21 and 23) are implemented using a diode. In another embodiment, the voltage limiters (21 and 23) are implemented using a diode-connection MOSFET. In one embodiment, the resistors (25 and 27) are implemented via a poly resistor, a PMOS transistor, a combination of poly resistor and a PMOS transistor, a parallel NMOS and PMOS structure, etc. Any known techniques for implement a resistor on a semiconductive substrate can be used.

When the impedance of the voltage limiters (21 and 23) is not negligible in comparison to the resistors (25 and 27), the impedance of the voltage limiters (21 and 23) can be added to the impedance of the resistors (25 and 27). Thus, the termination circuit can be effectively represented by ideal voltage limiters that have zero impedance and equivalent resisters. The ideal voltage limiters correspond to the voltage limiters (21 and 23) in FIG. 2; and the equivalent resistors correspond to the resistors (25 and 27). The use of the voltage limiters (21 and 23) reduces the DC current consumption and thus the power consumption of the termination circuit.

In one embodiment, the voltage limiters are controlled by an on/off signal. Thus, the resistors of the termination circuit can be selectively coupled to the power supply lines (e.g., $V_{cc}$ and ground). When the signal line is not used, the termination circuit can be decoupled from the power supply voltages to eliminate the power consumption by the termination resistors.

Using CMOS process, the limiting diodes can be implemented using Metal Oxide Semiconductor Field Effect Transistor (MOSFET).

Figure 3:
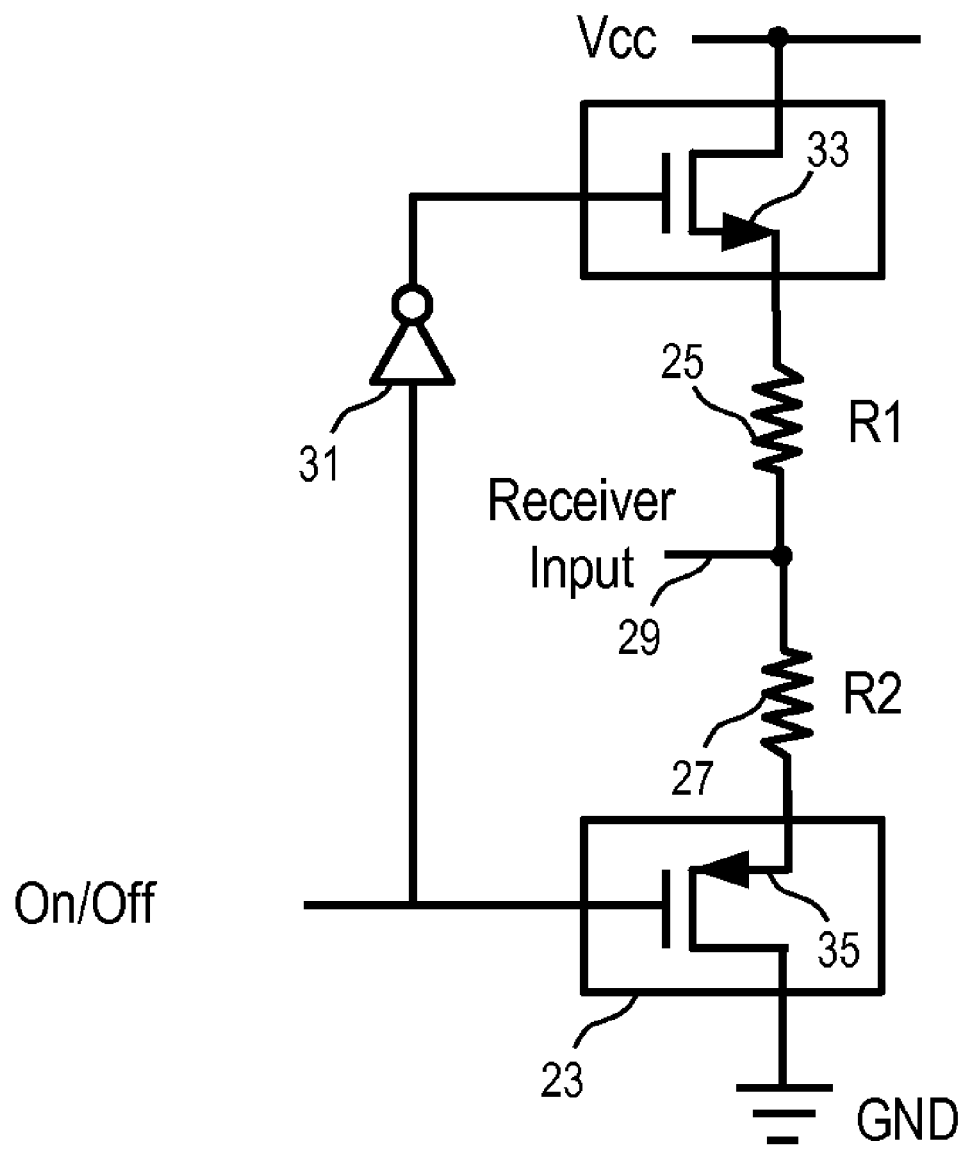
FIG. 3 shows a MOS termination circuit according to one embodiment.

FIG. 3 shows a MOS termination circuit according to one embodiment. In FIG. 3, an NMOS transistor (33) connected as a diode is used as a voltage limiter connected with resistor (25); and a PMOS transistor (35) connected as a diode is used as a voltage limiter connected with resistor (27). The transmission line is to be terminated at the receiver input point (29) between the resistors (25 and 27).

In FIG. 3, an inverter (31) is connected between the gates of the MOS transistors (33 and 35). The inverter (31) inverts the control signal for the MOS transistor (35) to generate the control signal for the MOS transistor (33). Alternatively, an inverter can be used to invert the control signal for the MOS transistor (33) to generate the control signal for the MOS transistor (35).

In FIG. 3, when the on/off control signal is on, the MOS transistors (33 and 35) are connected as diodes to function as voltage limiters. When connected as diodes, the MOS transistors (33 and 35) maintain substantially the same voltage between source and drain while allowing variable currents going through the MOS transistors (33 and 35).

In FIG. 3, when the on/off control signal is off, the MOS transistors (33 and 35) are biased to effectively disconnect the resistors (25 and 27) from the power supply voltage lines.

In FIG. 3, when the transconductor of the MOSFET is large enough for the operating currents in the termination circuit, the MOS transistors (33 and 35) maintain a constant voltage $V_T$ between source and drain, where $V_T$ is the threshold voltage of the MOSFET. Thus, the DC current in the termination circuit is reduced to $(V_{cc}-2\times V_T)/(4\times R)$.

In one embodiment, $V_T$ is designed to be comparable to $V_{cc}/2$ to reduce the DC current in the termination circuit. Thus, the DC current in the termination circuit can be very small in comparison to that in the traditional termination circuit. However, the voltage swing at the receiver input point (29) is small as well. The use of the voltage limiters trades off DC current with voltage swing.

FIG. 3 illustrates the use of one MOS transistor with each of the resistors (25 and 27). Alternatively, more than one MOS transistor can be connected in serial to provide a combined voltage limiter for each of the resistors (25 and 27). In some embodiments, a MOS transistor is used with one of the resistors but not the other. In some embodiments, the MOS transistors (33 and 35) on different branches circuits may maintain different voltages.

In one embodiment, a calibration circuit is used to determine the control signals for calibrating the impedance of the termination circuit. When the impedance of the voltage limiter is negligible in comparison with the required termination impedance, the calibration circuit can be used to calibrate the resistors (e.g., 25 and 27).

When the impedance of the voltage limiter is not negligible in comparison with the required termination impedance, the calibration circuit can be used to calibrate the impedance of the entire branches, including both the resistors and their voltage limiters near their operating conditions.

In one embodiment, in FIG. 3, the impedance of the branch between the receiver input point (29) and power supply line $V_{cc}$, including the resistor (25) and the voltage limiter (33), is calibrated when the current in the branch is in the range for the normal operation of the termination circuit (e.g., close to the operation point $(V_{cc}-2\times V_T)/(4\times R)$).

In one embodiment, the calibration circuit determines a control signal through reducing the different between a reference voltage and the change of voltage at the receiver input point due to a known current. The control signal is digitized, stored after the calibration, and used subsequently during the normal operation of the termination circuit (e.g., when the termination circuit is used to terminate a line for signal transmission).

In one embodiment, a redundant termination circuit having the same cells as the termination circuit to be calibrated is used to establish the normal operation condition. During the calibration phase, both termination circuits are connected between the power supply lines. One of the terminal circuits is connected to a current source. The voltage difference caused by the current source is compared to a reference voltage to drive a control signal for the calibration of the impedance of the termination circuits. After the calibration, the redundant termination circuit can be switched off from the termination circuit.

In one embodiment, an integrated circuit includes multiple termination circuits for multiple I/O pins. During the calibration phase, termination circuits can be paired to calibrate against each other, eliminating the need for actual redundant termination circuits on the integrated circuit. For example, two nearby termination circuits can be used as a pair of termination circuits for the calibration process. In one embodiment, paired termination circuits are placed close to each other on the substrate. Alternatively, a redundant termination circuit can be formed on the substrate near a termination circuit for an I/O pin as part of the calibration circuit.

Figure 4:
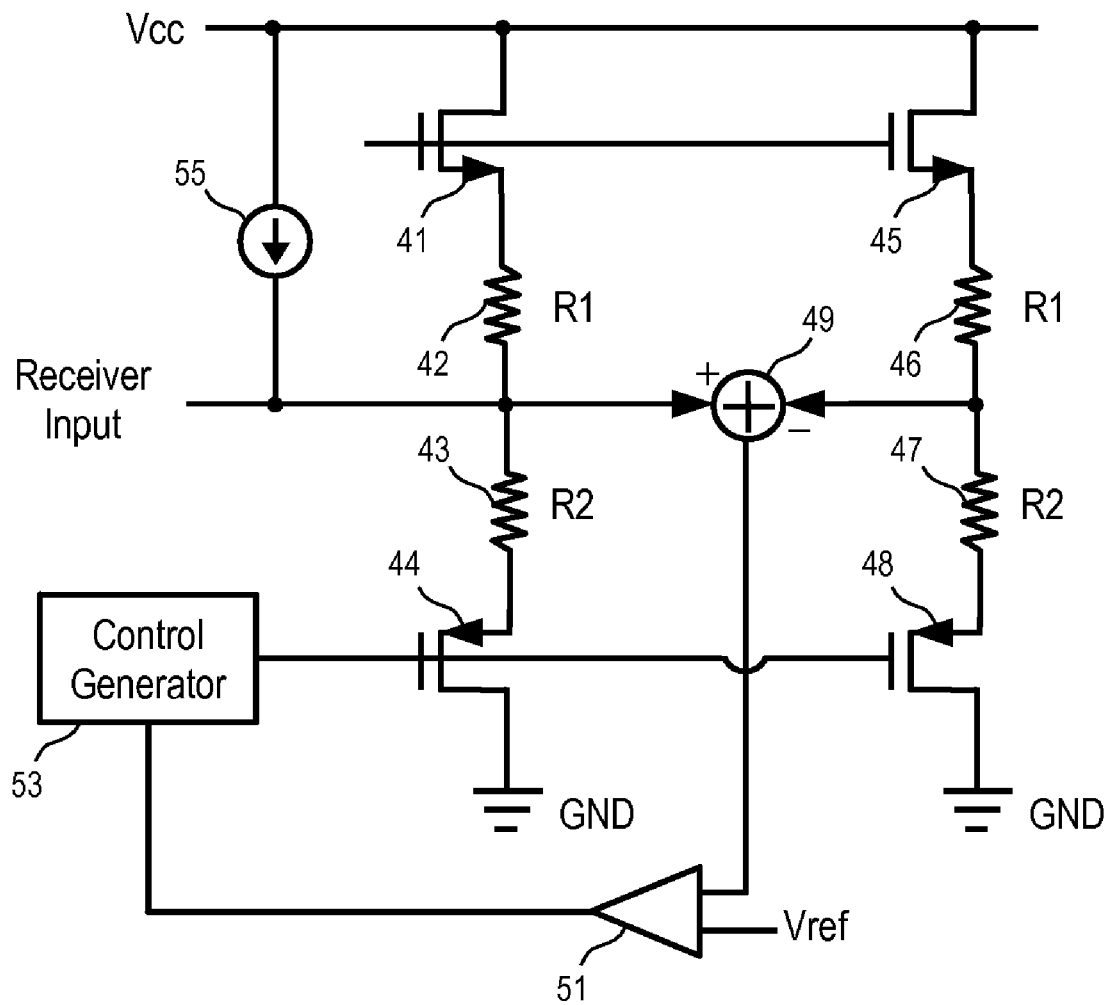
FIG. 4 shows an example of a termination circuit coupled to a calibration circuit to calibrate a PMOS based voltage limiter according to one embodiment.

FIG. 4 shows an example of a termination circuit coupled to a calibration circuit to calibrate a PMOS based voltage limiter according to one embodiment.

In FIG. 4, a pair of substantially same termination circuits are used to determine the control signal to calibrate the operation of the PMOS based voltage limiters (44 and 48). A first termination circuit of the pair has voltage limiters (41 and 44) and resistors (42 and 43) connected in serial between the power supply lines $V_{cc}$ and ground. A second termination circuit of the pair has voltage limiters (45 and 48) and resistors (46 and 47) connected in serial between the power supply lines $V_{cc}$ and ground. NMOS based voltage limiters (41 and 45) are designed to be the same; PMOS based voltage limiters (44 and 48) are designed to be the same; resistors (42 and 46) are designed to be the same; and resistors (43 and 47) are designed to be the same. Thus, the pair of the termination circuits operates in substantially the same conditions.

In FIG. 4, a current source (55) is coupled between $V_{cc}$ and the receiver input to inject a current into the first termination circuit that has the resistors (42 and 43) and the voltage limiters (41 and 44). The injected current causes a voltage increase at the receiver input point; and the voltage increase is a function of impedance of the termination circuit and the additional current $I_s$. The comparator (49) determines the voltage increase from the difference between voltages of the receiver input points of the termination circuits. The comparator (51) generates a control signal that is proportional to the difference between the voltage increase and the reference voltage $V_{ref}$. The control signal causes the control generator to adjust a digitized control signal which further generates a control signal for the PMOS based voltage limiters (44 and 48).

In one embodiment, the control generator includes an up/down counter to digitized the control signal which can be stored in memory and used in future operations of the termination circuits. Other types of digitization techniques can also be used.

In one embodiment, the control generator reaches a converged control signal when the impedance of the termination circuits reaches $V_{ref}/I_s$, where $I_s$ is the current injected into the termination circuit by the current source (55). In one embodiment, for the calibration process the ratio $V_{ref}/I_s$ is designed to be the require termination impedance R.

In FIG. 4, the impedance of the circuit path is adjusted using the control signal of the voltage limiters (44 and 48). Alternatively, the impedance can be adjusted via a control signal for voltage controlled resistors, as illustrated in FIG. 5.

Figure 5:
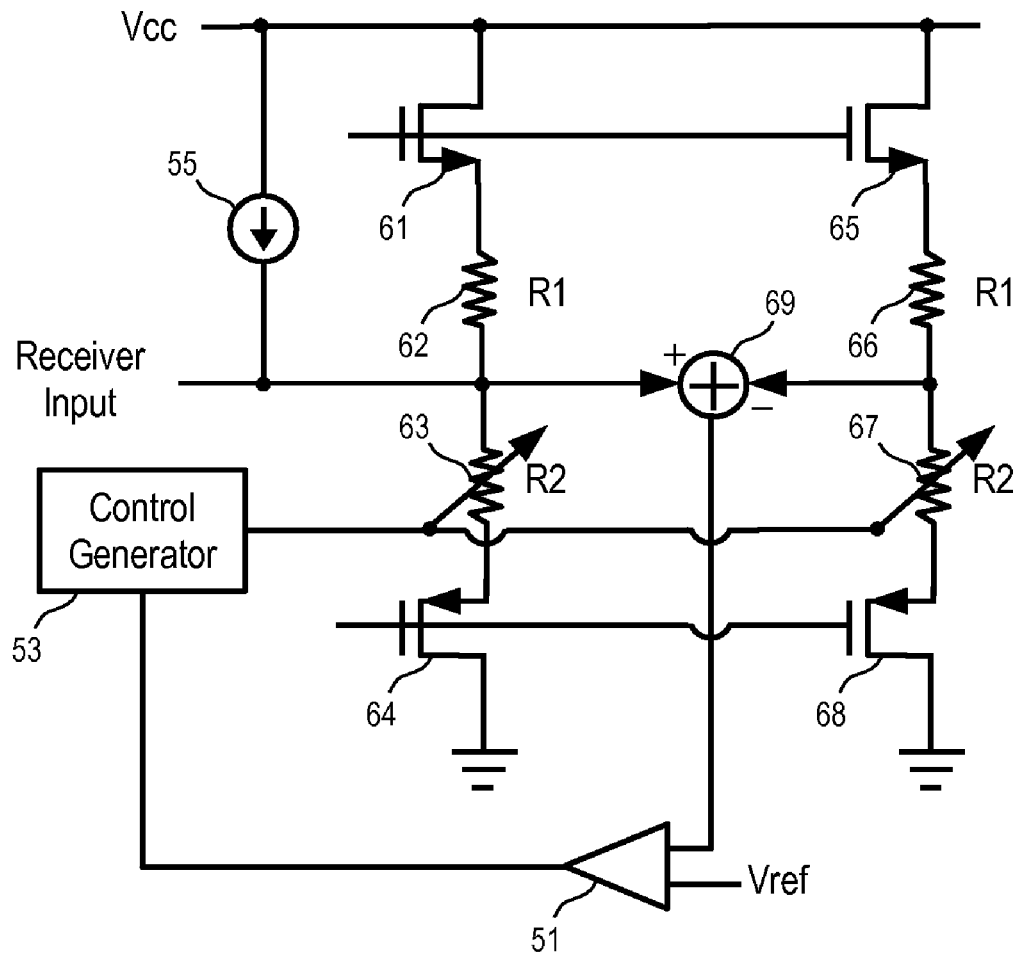
FIG. 5 shows an example of a termination circuit coupled to a calibration circuit to calibrate an adjustable resistor according to one embodiment.

FIG. 5 shows an example of a termination circuit coupled to a calibration circuit to calibrate an adjustable resistor according to one embodiment.

In FIG. 5, a pair of substantially same termination circuits is used to determine the control signal to calibrate impedance of the circuit path from resistor (63) through voltage limiter

(64) to ground and the circuit path from resistor (67) through the voltage limiter (68) to ground. In FIG. 5, voltage limiters (61 and 65) are substantially the same by design; voltage limiters (64 and 68) are substantially the same by design; resistors (62 and 66) are substantially the same by design; and resistors (63 and 67) are substantially the same by design. Thus, the pair of the termination circuits operates in substantially the same conditions.

In FIG. 5, a current source (55) is coupled between $V_{cc}$ and the receiver input to provide an additional current into the termination circuit of resistors (62 and 63) and voltage limiters (61 and 64). The additional current causes a voltage increase that is a function of impedance of the termination circuit and the provided additional current $I_s$. The adder/subtracter (69) determines the voltage increase from the difference between voltages of the receiver input points of the termination circuits. The comparator (51) generates a control signal that is proportional to the difference between the voltage increase and the reference voltage $V_{ref}$. The control signal causes the control generator to adjust a digitized control signal which further generates a control signal for the voltage controlled resistors (63 and 67).

In one embodiment, the current source (55) is generated by part of the calibration circuit integrated on the substrate of the integrate circuit chip. Alternatively, the current source can be provided via an I/O pin connected to the termination circuit. Alternatively, two current sources of known differences can be provided via the I/O pins connected to the pair of termination circuits to drive the voltage differences between the respective receiver input points of the termination circuits.

Figure 6:
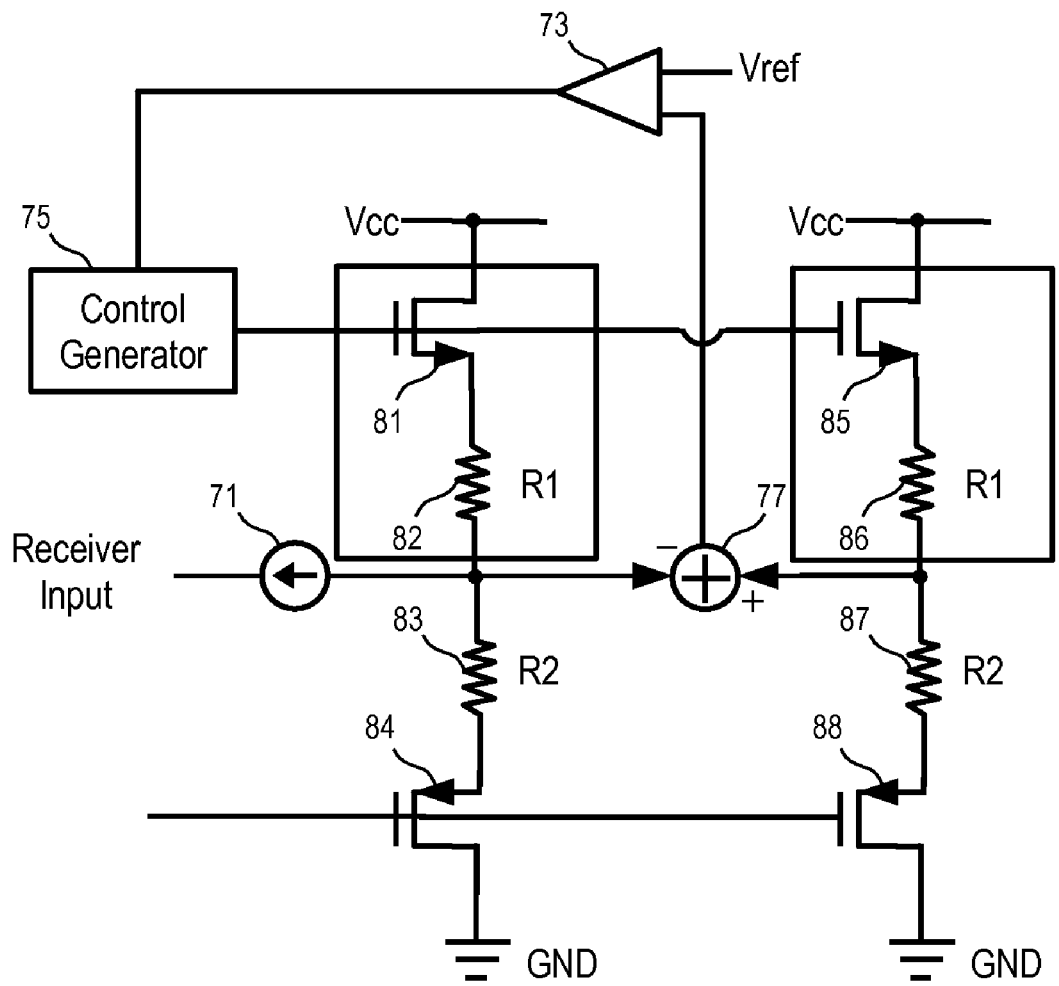
FIG. 6 shows an example of a termination circuit coupled to a calibration circuit to calibrate an NMOS based voltage limiter according to one embodiment.

FIG. 6 shows an example of a termination circuit coupled to a calibration circuit to calibrate an NMOS based voltage limiter according to one embodiment.

In FIG. 6, a pair of substantially same termination circuits is calibrated together. In FIG. 6, voltage limiters (81 and 85) are substantially the same; voltage limiters (84 and 88) are substantially the same; resistors (82 and 86) are substantially the same; and resistors (83 and 87) are substantially the same. Thus, the pair of the termination circuits are in substantially the same operating conditions when receiving the same receiver input.

In FIG. 6, a current source (71) is connected to draw a current from the termination circuit of resistors (82 and 83) and voltage limiters (81 and 84). The current drawn from the termination circuit causes a voltage decrease at the receiver input point; and the voltage decrease is a function of the impedance of the termination circuit and the current drawn by the current source (71). The adder/subtracter (77) determines the voltage decrease from the difference between voltages of the receiver input points of the termination circuits. The comparator (71) generates a control signal that is proportional to the difference between the voltage increase and the reference voltage $V_{ref}$. The control signal causes the control generator to adjust a digitized control signal which further generates a control signal to adjust the impedance of the resistors (82 and 86) and/or the voltage limiters (81 and 85).

In FIG. 6, the control signal generated by the control generator (75) when the impedance of the termination circuit reaches $V_{ref}/I_s$, where $I_s$ is the current drawn by the current source from the termination circuit of resisters (82 and 83). The ratio $V_{ref}/I_s$ is designed to be the same as the require termination impedance R. Thus, when the control signal of the control generator (75) reaches a converged value, the termination circuits have the desired termination impedance R.

FIGS. 4-6 show examples where the impedance of one branch of the termination circuit, starting from the receiver input point to either $V_{cc}$ or ground (e.g., the branch of resistor 82 through voltage limiter 81 $V_{cc}$ in FIG. 6, or the branch of resistor 43 through voltage limiter 44 to ground in FIG. 4), is adjusted for the calibration of the termination impedance.

Alternatively, both branches of the termination circuit can be adjusted or calibrated at the same time. For example, the impedance of the both branches of the termination circuit can be adjusted in a symmetric way. For example, the impedance of both branches can be tuned up at the same time, or tuned down at the same time, based on the output of the comparator (e.g., 51 or 73).

In a further example, the impedance for the two branches is tuned to have substantially the same impedance. Thus, when there is no input signal, the receiver input point is biased at $V_{cc}/2$.

Thus, at least one embodiment of the invention provides a low power consumption termination circuit for high-speed wire-line interconnection between integrated circuit (IC) chips, which may require impedance matching at near-end or far-end or both to avoid the signal degrading due to reflection. In one embodiment, the termination circuit provides the desired AC impedance but consumes only a fractional DC current of a traditional termination circuit and therefore is attractive for power-aware systems.

In one embodiment, the use of voltage limiters decouples the design of the AC impedance of the termination circuit and the DC current consumption of the termination circuit. Thus, designers have the freedom to choose different DC current while implementing the required AC impedance.

In the foregoing specification, the disclosure has been provided with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A termination circuit integrated on a substrate to terminate a transmission line connected from outside the substrate, the termination circuit comprising:
   a port to interface with the transmission line;
   a first resistive path coupled between the port and a first power supply voltage provided on the substrate, the first resistive path including a first voltage limiter, wherein impedance of the first resistive path is controlled by a first voltage;
   a second resistive path coupled between the port and a second power supply voltage provided on the substrate, the second resistive path including a second voltage limiter, wherein impedance of the second resistive path is controlled by a second voltage; and
   a calibration circuit to determine the first and second control voltages during a calibration mode.

2. The termination circuit of claim 1, wherein the first power supply voltage is $V_{cc}$; and the second power supply voltage is ground.

3. The termination circuit of claim 1, wherein the first resistive path and the second resistive path have substantially equal impedance.

4. The termination circuit of claim 3, wherein the first voltage limiter and the second voltage limiter are to maintain substantially equal and constant voltages when the first and second resistive paths have changing currents.

5. The termination circuit of claim 4, wherein the first voltage limiter comprises a diode; and the second voltage comprises a diode.

6. The termination circuit of claim 4, wherein the first voltage limiter comprises a Metal Oxide Semiconductor Field Effect Transistor (MOSFET) biased to maintain a constant voltage; and the second voltage limiter comprises a Metal Oxide Semiconductor Field Effect Transistor (MOSFET) biased to maintain a constant voltage.

7. The termination circuit of claim 6, wherein the first voltage limiter comprises an n-channel transistor; and the second voltage limiter comprises a p-channel transistor.

8. The termination circuit of claim 6, further comprising:
an inverter coupled between the first and second voltage limiters to provide an inverted version of a bias signal of the first voltage limiter to the second voltage limiter.

9. The termination circuit of claim 1, wherein the calibration circuit comprises a third resistive path connected to a fourth resistive path, the third resistive path substantially same as the first resistive path, the fourth resistive path substantially same as the second resistive path.

10. The termination circuit of claim 9, wherein during the calibration mode,
a known current is connected with the port,
the third and fourth resistive paths are coupled between the first and second power supply voltages, and
a reference voltage is compared with a voltage difference between the port and a connection point between the third and fourth resistive paths to determine the first control voltage.

11. An on-die termination circuit of an integrated circuit, comprising:
a first resistor element, wherein impedance of the first resistor element is adjustable via a control signal;
a second resistor element coupled with the first resistor element, a signal transmission line to be connected to a point between the first and second resistor elements for termination;
a first voltage limiter coupled between the first resistor element and a first power supply voltage of the integrated circuit;
a second voltage limiter coupled between the second resistor element and a second power supply voltage of the integrated circuit; and
a calibration circuit, during a calibration mode the calibration circuit to be coupled to the termination circuit to determine the control signal to calibrate impedance between the first power supply voltage and the point between the first and second resistor elements, during a normal operation mode the calibration circuit to be decoupled from the termination circuit.

12. The termination circuit of claim 11, wherein the first voltage limiter comprises an NMOS transistor biased to maintain a constant voltage between source and drain; and the second voltage limiter comprises a PMOS transistor biased to maintain a constant voltage between source and drain.

13. The termination circuit of claim 12, further comprising:
an inverter coupled between a gate of the NMOS transistor and a gate of the PMOS transistor.

14. The termination circuit of claim 13, wherein the integrated circuit comprises a Complementary Metal Oxide Semiconductor (CMOS).

15. The termination circuit of claim 11, wherein the calibration circuit comprises a current source selectively coupled to the point between the first and second resistor elements.

16. A device having an integrated circuit formed on a semiconductive substrate, the device comprising:
an input/output (I/O) pin to connect the integrated circuit to a signal transmission line from outside of the device;
a termination circuit coupled with the I/O pin and integrated on the semiconductive substrate, the termination circuit to provide a predetermined termination impedance for the transmission line, the termination circuit including a first resistor, a second resistor and at least one voltage limiter connected in serial between a first power supply voltage and a second power supply voltage, the I/O pin being connected between the first and second resistors; and
a calibration circuit integrated on the semiconductive substrate, the calibration circuit coupled with the termination circuit in a calibration mode and decoupled from the termination circuit during a normal operation mode, the calibration circuit comprising a circuit path to provide a known current through one of the first and second resistors when in the calibration mode, the calibration circuit further comprising a control signal generator to determine a control signal to adjust one of the first and second resistors based on comparing a reference voltage with a voltage change caused by the known current.

* * * * *